(12) United States Patent
den Besten et al.

(10) Patent No.: US 8,836,408 B1
(45) Date of Patent: Sep. 16, 2014

(54) HIGH-SPEED SWITCH WITH SIGNAL-FOLLOWER CONTROL OFFSETTING EFFECTIVE VISIBLE-IMPEDANCE LOADING

(71) Applicant: NXP B.V., Eindhoven (NL)

(72) Inventors: Gerrit Willem den Besten, Eindhoven (NL); Madan Vemula, Tempe, AZ (US); Jingsong Zhou, Gilbert, AZ (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 13/839,687

(22) Filed: Mar. 15, 2013

(51) Int. Cl.
*H03K 17/16* (2006.01)
*H03K 17/30* (2006.01)

(52) U.S. Cl.
CPC ................... *H03K 17/162* (2013.01)
USPC ............ 327/382; 327/379; 327/551; 327/310

(58) Field of Classification Search
USPC .................................................. 327/379, 382
See application file for complete search history.

(56) References Cited

U.S. PATENT DOCUMENTS

| | | | |
|---|---|---|---|
| 5,818,099 A | 10/1998 | Burghartz | |
| 7,564,275 B2 * | 7/2009 | Bien | 327/109 |
| 2010/0001787 A1 | 1/2010 | Brunsilius et al. | |
| 2011/0001542 A1 * | 1/2011 | Ranta et al. | 327/382 |
| 2011/0025408 A1 | 2/2011 | Cassia et al. | |
| 2012/0119794 A1 | 5/2012 | Den Besten | |
| 2012/0146705 A1 * | 6/2012 | Den Besten | 327/333 |
| 2012/0256678 A1 | 10/2012 | Sun et al. | |
| 2012/0286588 A1 | 11/2012 | Steeneken | |
| 2013/0015901 A1 * | 1/2013 | Kitsunezuka | 327/356 |

OTHER PUBLICATIONS

Extended European Search Report for EP Patent Appln. No. 14157894.8 (Jun. 18, 2014).

* cited by examiner

*Primary Examiner* — Adam Houston (57) ABSTRACT

A data link circuit switches high-speed signals through FET-based circuitry between channels. A FET responds to control signals at the gate terminal to operate in either a signal-passing mode or another (blocking) mode. In the passing mode, an AC (high-speed) signal is passed between the S-D terminals by coupling a first signal portion (of the AC signal) and with another signal portion diverted by the inherent capacitances associated with the FET. For offsetting the loading caused by the inherent capacitances associated with the FET-based switch, a biasing circuit is configured and arranged to bias the back-gate terminal of the FET transistor with a follower signal.

23 Claims, 7 Drawing Sheets

HIGH-SPEED SWITCH WITH SIGNAL-FOLLOWER CONTROL OFFSETTING EFFECTIVE VISIBLE-IMPEDANCE LOADING

Various aspects of the disclosure are directed to high-speed switches, and more particularly to high-speed switches as might be used in multiplexer circuits.

The demand for higher data rates and bandwidth in electronic devices and in electronic communications continues to rise. In particular, the data rate of standards for the transmission of digital signals has been continually increasing. For instance, the USB 3.0 standard now supports a transmission rate of 5 Gb/s, recent versions of PCI Express (e.g., 3.0) include a transmission rate of 8 Gb/s, and Thunderbolt operates at roughly 10 Gb/s. Such standards are pushing beyond 10 Gb/s, and are expected to continue to increase.

As communication speed has been increasing, it has been difficult for switching circuits to meet the requirements of bandwidth, loss and other characteristics pertaining to these communications. Field effect transistor (FET) broad frequency bandwidth switches, such as transistor-based switches, behave as a controlled resistor with additional parasitic capacitors. Low on-resistance, high off-resistance, and low capacitances can be desirable, but can be limited due to the voltage levels of signals that are passed via the transistor-based switches. It has been challenging to reduce both on-resistance and on/off capacitances, while achieving desirable voltage signal values. For example, increasing the area of a transistor can reduce its resistance, but increase its capacitance such that the product of resistance and capacitance remains roughly constant. Other approaches to reducing this resistance-capacitance product can adversely affect achievable signal voltage.

As one example of such demands, high performance galvanic switches are essential elements for multiplexing of electronic signals without buffering. An important advantage of galvanic multiplexers is that these are bidirectional, transparent, and conceptually simple, which creates many opportunities for virtually extending the number of ports as long as the switch characteristics do not impact the signals significantly.

High-speed signal routing in a one-by-two multiplexer circuit involves a galvanic switch configuration, where one signal port is connected to one of two other ports using a control port (e.g., the gate) of a transistor circuit to selectively pass or block the signal between the signal-communicating (e.g., the source/drain) transistor terminals. In a FET, for example, the gate is used to selectively control whether the source/drain terminals operate in the on-state (conductive/signal-passing) or the off-state. This basic multiplexer configuration can be readily extended to an N-by-M port design for much more complex signal routing.

There is an increasing demand for applications involving more complex signal routing configurations and/or higher-speed signal switching performance without signal degradation. These applications often specify multiplexing of the signals at much higher speeds (e.g., approaching and exceeding 10 Gbps) and more multiplexing paths in the multiplexer circuitry or by using cascades of multiplexer circuitry. With FET-based technology commonly used to for switching, aspects of this disclosure are directed to addressing such demands within the contexts and limits of such existing technology.

These FET-based contexts and limits include significant parasitic capacitances and limited drain-source conductance, both of which scale with the FET transistor width and limit the performance. Using MOSFET transistor-based switching as an example, the $R_{on}*C_{par}$ metric (on-state RC time constant defined by the design's inherent resistance and capacitance) characterizes an importance performance metric that is used. As the feature size provided by technology advancements decreases, this metric typically provides some improvement with every such advancement (or "technology node").

Ongoing issues concerning higher signal voltages imply that the FET advanced transistors cannot be used, as they would be more likely to provide the needed speed performance, but would break down. For example, 3.3V levels continue to be commonly used to interface the signals involved in such high-speed switching. In contrast, for example, CMOS-type FET devices with gate lengths of 120 nm can only withstand about 1.2V, and for smaller feature size devices, even less. Avoiding complex structures for addressing these limits, thicker oxide devices have been used with longer gate length, but these also have much worse performance. A classic switch structure in CMOS technology is a pass gate which works rail-to-rail, but with a relatively poor RC metric and non-linear resistance, depending on signal level. CMOS technology has also shown that one of the complementary transistors (usually the NFET) has substantially better performance than the other; this tends to limit the supported signal voltage range as a fraction of the maximum gate drive of the switch, and does not reduce the non-linearity with signal level.

This disclosure discusses, and in some instances illustrates, various example embodiments that are directed to switching circuits useful for a variety of applications and useful for addressing various challenges, including those discussed above. For example, in certain embodiments, this disclosure is directed to the fourth (back-gate) terminal of the FET switch being configured to follow the signal in a gate-follows-signal switch topology, where the source and drain junction capacitors can be performance limiting, thereby providing significantly improved bandwidth, return loss, and linearity of the switch. Some embodiments might also make FET switches suitable for selecting and multiplexing of RF signals.

Aspects of this disclosure are directed to apparatuses (e.g., circuits and systems) and related methods to reduce the parasitic capacitance impact of the source and drain junction capacitors, enabling significant further performance improvement for switches. According to certain embodiments, this technique reduces the effective parasitic capacitance when the gate capacitance is utilized to make the gate follow the signal (e.g., as described herein), and barely loads the source and drain nodes which carry the signal. While the parasitic capacitance associated with the gate node has been understood to dominate such signal loading, aspects of this disclosure are directed toward using a switch topology where these inherent capacitances become largely invisible to the signal and the remaining most dominant performance limitations originate from junction-related capacitors. In connection with detailed/experimental embodiments involving use of this switch topology, it has been discovered that by properly addressing these remaining performance limitations, vastly improved signal switching performance can be realized on the order of five-ten times and in many instances, by much greater performance margins.

In more specific aspects, the disclosure provides ways for reducing the effectively visible capacitance, as opposed to the actual physical capacitance. In these aspects, this can be achieved by offsetting the effective signal loading, attributable to certain parasitic (inherent) capacitances including, for example, the remaining performance limiting source and drain junction capacitors. Such loading is offset by a controlled signal ("follower signal") as presented on the other side of the source and drain junction capacitance, where this controlled signal or follower signal tracks with the signal passing between the source-drain terminals. In this way, the circuitry operates by lessening or minimizing the differential signal in light of the total parasitic capacitance to provide a robust offset for reducing or eliminating the loading of the signal passing across the channel (between the source-drain terminals). Although this can never be achieved perfectly, when only 10% of the signal is visible across the source and drain junction capacitance, a ten-fold reduction of capacitive loading is realized.

In a more specific example embodiment, the disclosure is directed to a high-speed communications circuit (e.g., including a printed circuit board and chip-implemented circuitry, such as a logic circuit, on the printed circuit board and a multiplexer). The communications circuit provides a data link for switching a high-speed signal through a FET-based circuit from a primary channel to one of one or more secondary channels. The FET-based switch circuit includes a FET transistor having gate, back-gate, source, and drain terminals, with the FET-based switch being configured and arranged to respond to control signals presented at the gate terminal. The switch is configurable to operate in a signal-passing mode and, in the selected alternative, in another (signal-blocking) mode. In the signal-passing mode, a (high-speed) signal is passed between the source and drain terminals by coupling a first portion of a signal between the source and drain terminals and another portion of the signal is diverted due to AC-coupling across inherent capacitances associated with the FET-based switch. The switch operates in the other mode by substantially blocking or mitigating passage of the signal between the source and drain terminals to such a degree that the effective use of the signal across the channel is negated. For offsetting the loading caused by the inherent capacitances associated with the FET-based switch, a biasing circuit is configured and arranged to bias the back-gate terminal of the FET transistor with a follower signal.

The above discussion is not intended to describe each embodiment or every implementation of the present disclosure. The figures and following description also exemplify various embodiments.

Various example embodiments may be more completely understood in consideration of the following detailed description in connection with the accompanying drawings, in which.

While embodiments are amenable to various modifications and alternative forms, specifics thereof have been shown by way of example in the drawings and will be described in detail. It should be understood, however, that the intention is not to limit applicability to the particular embodiments and examples described herein. On the contrary, the intention is to cover all modifications, equivalents, and alternatives thereof including aspects defined in the claims. Furthermore, the term "example" as used throughout this document is by way of illustration, and not limitation.

Aspects of this disclosure are directed to apparatuses (e.g., circuits and systems) and methods to reduce the parasitic capacitance impact of the source and drain junction capacitors, enabling significant further performance improvement for switches. According to certain embodiments, this technique reduces the effective parasitic capacitance, beyond that attributable as the gate capacitance, to offset the remaining performance limitations of the switch using a back-gate control signal that barely loads the source and drain nodes. In more specific aspects, methods are disclosed for reducing the effectively visible capacitance, as opposed to the actual physical capacitance. In these aspects, this is achieved by offsetting the effective signal loading, attributable to the parasitic gate capacitance and also to the other inherent capacitances including, for example, the remaining performance limiting source and drain junction capacitors. Such loading is offset by a controlled signal ("follower signal") presented on the other side of the capacitances where this controlled signal, or follower signal, tracks with the signal passing between the source-drain terminals.

According to an example embodiment, a switching arrangement includes a data link switchably connectable between channels by a FET-based switch including a FET transistor having gate, back-gate, source, and drain terminals. The FET-based switch is configured and arranged to respond to control signals at the gate terminal by operating in a signal-passing mode, in which an AC signal is passed between the source and drain terminals by coupling a first portion of a signal between the source and drain terminals. In this so-called FET on-state, another portion of the AC signal is lost through (or diverted due to) AC-coupling across inherent capacitances associated with the FET-based switch. In another (blocking) mode, the switch operates to substantially block passage of the signal between the source and drain terminals. A biasing circuit is implemented to bias the back-gate terminal of the FET transistor with a follower signal and therein offset the loading caused by the FET's inherent capacitances including, for example, the gate-related capacitances and the junction capacitances specific to the FET.

In many switch topologies, the source and drain junction capacitances are connected to the signal at the source and drain nodes respectively, while the other side of these capacitors is formed by a well or substrate (typically connected to a supply). The junction capacitors present a loading on the signal, and the signal across the capacitors is reduced by driving a portion of the signal on the source and/or drain terminals of the FET switch to the back-gate, for example a follower signal tracking the same high-speed (AC) signal intended to be passed by the switch when in the on-state. This can be achieved, for example, using a driver, or passively by creating a higher impedance (as viewed) from a back-gate node to any node other than the signal nodes, compared to the impedance from the back-gate node to the signal nodes, or a combination of these.

This approach can be used to both reduce signal loading capacitance and improve linearity. As the signal is going to all four terminals of the basic FET structure, the back-gate voltage variation is largely reduced and therefore the on-resistance variation due to the body-effect is largely eliminated.

Different biasing circuits may be utilized in different embodiments. For instance, biasing circuits may use a driver circuit and/or a passive circuit to provide AC and DC bias signals to the back-gate of the switching circuit. For instance, in some embodiments, the biasing circuit is configured and arranged to bias the back-gate terminal of the FET transistor by driving the back-gate terminal with a bias signal (e.g., a follower signal corresponding to a high-frequency (AC) signal passed by the switch). The follower signal does not have to follow perfectly; for example, the voltage/phase doesn't have to follow exactly as the specific design would be adjusted to optimize the effective loading-offset function by the follower signal to realize a substantial improvement (e.g., at least twenty percent).

In some embodiments, the back-gate terminal may be driven with AC and/or DC bias signals. The bandwidth of the circuit used to drive the back-gate terminal may limit the frequency range for which the capacitance is effectively reduced.

In some embodiments, passive circuitry may be included to passively assist in providing the follower signal to the back-gate terminal. In an example passive bias circuit, the impedance that effectively loads the signal consists of a capacitor (from the source signal to the back-gate terminal) in series with the impedance that is seen at the back-gate terminal (excluding this capacitor). The loading will therefore be reduced and performance improved if the latter impedance is increased. The passive biasing circuitry causes the back-gate terminal to have high-impedance to any node other than the source of the bias signal.

In one example implementation, the biasing circuit may be configured to passively provide the follower signal to the back-gate terminal. In some implementations, biasing circuits are configured to also provide DC bias to the back-gate terminal in addition to the follower signal. In some embodiments, the biasing circuit is configured to bias the back-gate terminal toward a reference voltage so that the impedance (as viewed from source or drain) causes a desired biasing signal (e.g., the follower signal) to be provided to the back-gate terminal. In some specific implementations, the series resistance of the bias is towards the reference voltage.

In some embodiments, a controller circuit is configured to selectively generate the control signals at the gate terminal and for controlling the modes and the application of an actuation voltage to the biasing circuit. In this manner, a voltage bias is presented to the back-gate terminal, depending on the controlled modes of operation.

In some embodiments, a FET based switching circuit is implemented in various semiconductor regions to provide biasing to a back-gate terminal. For instance, in one implementation, the switching circuit includes a plurality of source and drain regions in a P-type well region of a substrate. Gate regions are included on the P-type well, in-between the source and drain regions, to form one or more FETs. In some embodiments, for isolation reasons, switches with unequal signals are located in separate P-wells so as to avoid an implicit coupling path which causes extra loading.

The P-type well region is a P-type region, in which the back-gate terminals of the FETs may be biased. Additional regions may be included to facilitate providing bias signals to the back-gate terminal. For instance, in some implementations, biasing signals may be provided to the back-gate terminal using a resistive path through a number of regions including, e.g., the P-type well, the substrate, and isolation regions. In one embodiment, the biasing circuit provides a resistor in a series resistance path to pass bias signals to the back-gate terminal through the P-type well. In one implementation, the biasing circuit provides a second resistor configured to bias an N-type isolating layer underneath and around the P-type well. The N-type isolating layer may, for example, include a deep N-well. Alternatively, vertical isolation could be achieved with an isolating layer using an SOI process.

Figure 1A:
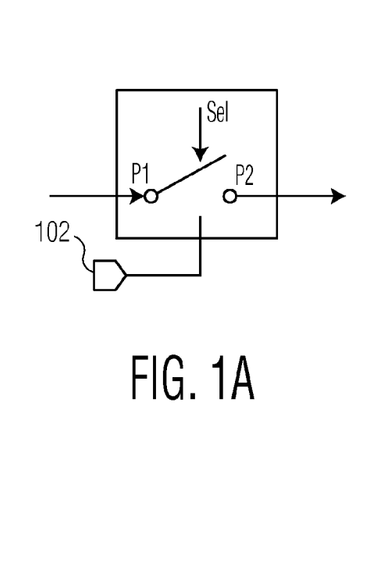
FIG. 1A shows a switching circuit including an exemplary switch that selectively couples primary and secondary data links, with a biasing circuit for offsetting the loading caused by the inherent capacitances associated with the switch, in accordance with an example embodiment of the present disclosure.

Turning now to the figures, FIG. 1A shows a switching circuit including an exemplary switch that selectively couples primary and secondary data links, with a biasing circuit for offsetting the loading caused by certain inherent capacitances, including the source and drain junction capacitances, associated with the switch, in accordance with an example embodiment of the present disclosure. The switching circuit shown in FIG. 1A is a FET based switch configured to provide a data link between nodes P1 and P2 (e.g., source and drain terminals of a FET switch) in response to a selection signal (e.g., Sel). The switching circuit includes a biasing circuit 102 that is configured to provide a voltage to the FET switch to offset the loading caused by these inherent capacitances associated with the switch.

Figure 1B:
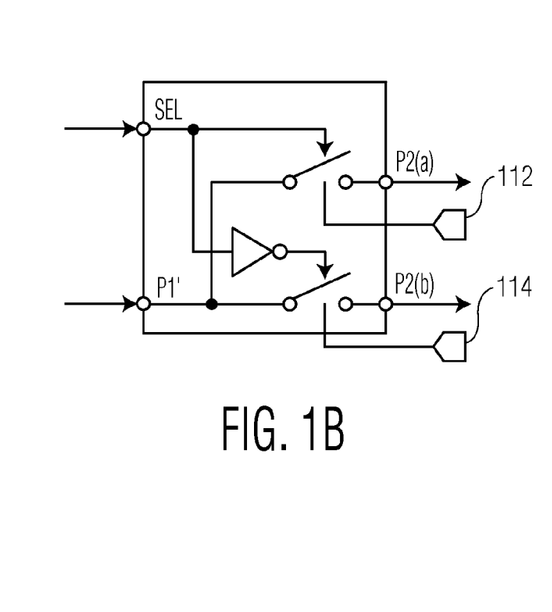
FIG. 1B shows a similar switching circuit including switches that selectively couple primary and secondary data links, with a similarly-depicted biasing circuit for offsetting the loading caused by the inherent capacitances, in accordance with an example embodiment of the present disclosure.

Switches, such as that shown in FIG. 1A, can be connected to implement a high-speed multiplexor switch. FIG. 1B shows two switching circuits configured and arranged to form a multiplexor that selectively couples an input port (e.g., node P1) to one of a primary or a secondary output ports (e.g., P2(a) and P2(b)). Each data link is selectively coupled to the input of a respective switch (such as the switch shown in FIG. 1A) in response to a selection signal (e.g., Sel). As described with reference to FIG. 1A, each switch includes a respective biasing circuit (e.g., 112 or 114) that is configured to offset the loading caused by the above-noted capacitances. In this configuration, the switches form a 1×2 multiplexer. The configuration can be extended to implement a multiplexor with additional input or output ports. In such extension, each additional switch can similarly include a respective biasing circuit to offset loading of capacitance of the switch.

The switches shown in FIGS. 1A and 1B can be implemented in a number of different switching circuits. For instance, in some embodiments, each switch may be implemented with a single FET. In some other embodiments, multiple FETs may be arranged to implement each switch. For instance, FIG. 2 shows a switching circuit that can be used to selectively couple a high-speed signal at source and/or drain terminals to the back-gate in response to a gate-driving biasing circuit (not shown) used for offsetting the loading caused by the inherent capacitances associated with the FET, in accordance with an example embodiment of the present disclosure.

Figure 2:
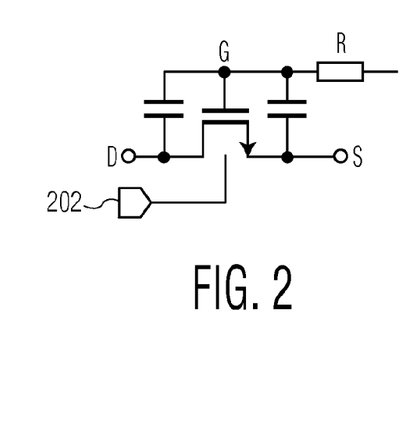
FIG. 2 shows a switching circuit including a MOSFET switch that selectively couples a high-speed signal at source and drain terminals in response to a gate-driving biasing circuit used for offsetting the loading caused by the inherent capacitances associated with the MOSFET, in accordance with an example embodiment of the present disclosure.
Figure 3A:
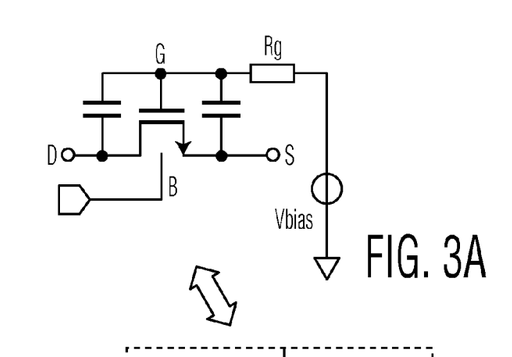
FIG. 3 (including interrelated parts 3A, 3B, 3C and 3D) shows an N-type MOSFET switching circuit (3A) bearing a similar construction to the circuit shown in FIG. 2, an illustrated model of the N-type MOSFET switching circuit (3B), and expanded versions thereof for the on-state condition (3C) and the off-state condition (3D), also in accordance with example embodiments of the present disclosure.
Figure 3B:
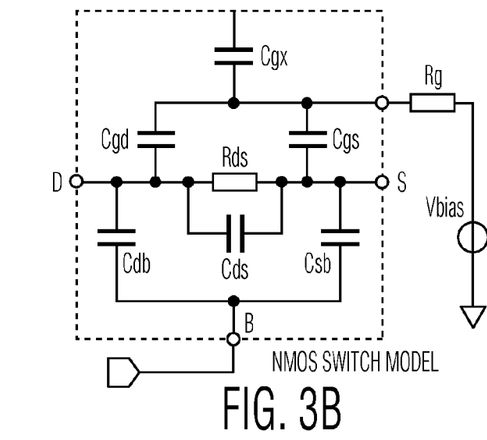
Figure 3C:
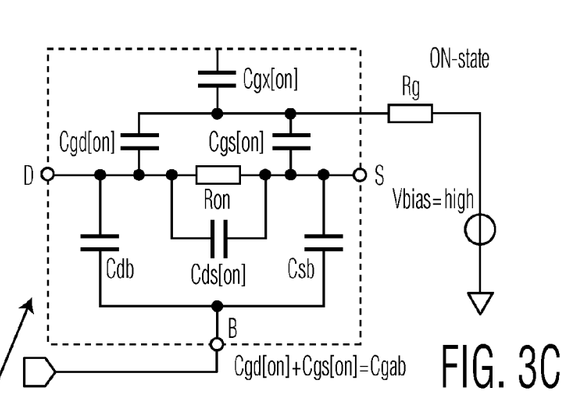
Figure 3D:
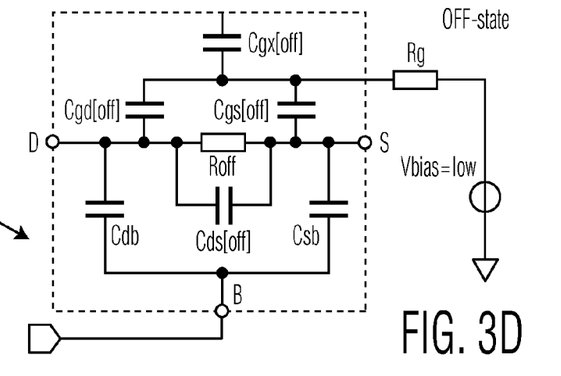

The circuit in FIG. 2 shows a single FET circuit that may be used to implement the switches shown in FIGS. 1A and 1B. The FET is configured to selectably pass an AC signal between source and drain nodes in response to a signal provided to a gate of the FET. A biasing circuit 202 is configured to offset the loading caused by the inherent capacitances of the FET. While embodiments are applicable to a number of switching circuits, for ease of explanation and illustration, the examples herein are primarily described with reference to a single MOSFET. It is understood that these approaches and teachings (generally) may be similarly applied to switches implemented using other forms of transistors such as other configurations of MOSFETS and CMOS based switches.

FIG. 3 includes four interrelated diagrams 3A, 3B, 3C, and 3D. The first, FIG. 3A shows an N-type MOSFET switching circuit, with a similar construction as the circuit shown in FIG. 2. FIG. 3B shows an illustrated model of the N-type MOSFET switching circuit shown in FIG. 3A, which illustrates parasitic capacitances between source, drain, gate, and back-gate terminals of the MOSFET. FIG. 3C shows the model in FIG. 3B, for an on-state of the switching circuit, where the gate is driven by a Vbias signal having a high-voltage level. Conversely, FIG. 3D shows the model in FIG. 3B, for an off-state of the switching circuit, where the gate is driven by a Vbias signal having a high-voltage level.

Figure 4A:
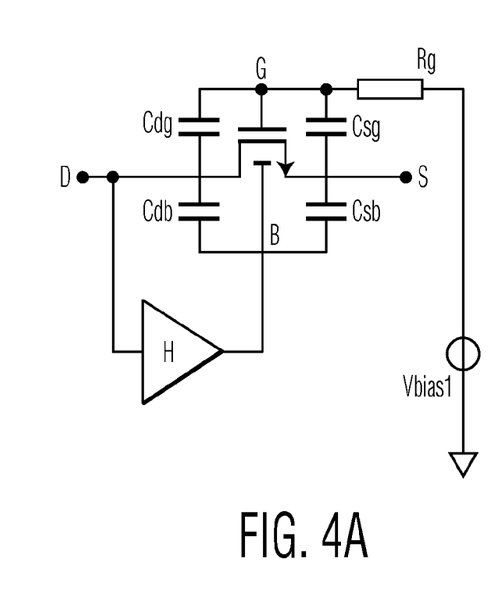
FIG. 4A shows a switch circuit arrangement such as the switching circuit of FIG. 2, but also showing certain inherent capacitances between drain and back-gate and source and back-gate, which are typically dominated by source and drain junction capacitances, and signals for biasing the inherent capacitances toward a substrate, and with a follower signal provide by a driver, in accordance with another example embodiment of the present disclosure.

FIG. 4A shows a switching circuit arrangement such as the switching circuit of FIG. 2 along with an illustration of certain inherent capacitances between drain and back-gate and source and back-gate, which are typically dominated by source and drain junction capacitances, and signals for biasing the inherent capacitances toward a substrate region. The switch includes a biasing circuit having a driver configured to provide a follower signal to a back-gate of the MOSFET. The follower signal used to drive the back-gate may be obtained, for example, from a source or drain terminal, as shown in FIG. 4A.

The MOSFET has gate, back-gate, source, and drain terminals and the FET-based switch is configured and arranged to respond to control signals at the gate terminal. The MOSFET is configured to operate in a signal-passing mode and a non-passing mode in response to the control signals. In the signal passing mode, an AC signal is passed between the source and drain terminals by coupling a first portion of a signal between the source and drain terminals and another portion of the AC signal is diverted due to AC-coupling across inherent capacitances associated with the FET-based switch. In the non-passing mode, passage of the signal between the source and drain terminals is substantially blocked.

The biasing circuit is configured to bias the back-gate terminal of the MOSFET transistor with a follower signal. As described above, the follower signal provides a voltage to the back-gate terminal, which approximates the AC voltage provided to the other end of the back-gate capacitance (e.g., source and drain). In this manner, loading caused by the inherent capacitances associated with the FET-based switch is offset.

Figure 4B:
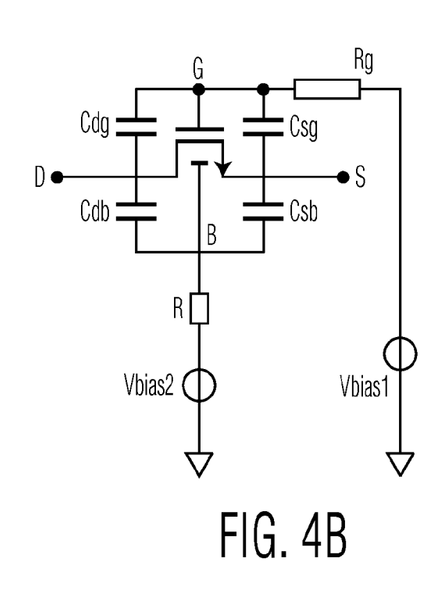
FIG. 4B shows another high-speed MOSFET switch, in accordance with another example embodiment of the present disclosure, similar to FIG. 4A but with a resistively-coupled bias circuit to the back-gate terminal.

In some embodiments, a switching circuit is implemented with biasing circuitry configured to facilitate providing an AC biasing signal (e.g., a follower signal) to the back-gate terminal of a MOSFET along with a DC biasing signal. FIG. 4B shows another MOSFET switch with a biasing circuit, in accordance with another example embodiment of the present disclosure. The switch shown in FIG. 4B is similar to that shown in FIG. 4, but also includes a resistively-coupled bias circuit configured to facilitate providing a biasing signal to the back-gate. A DC biasing signal is provided via resistively-coupled bias circuits and an AC biasing signal is provided (or driven) via the inherently present capacitors of the MOSFET.

Figure 4C:
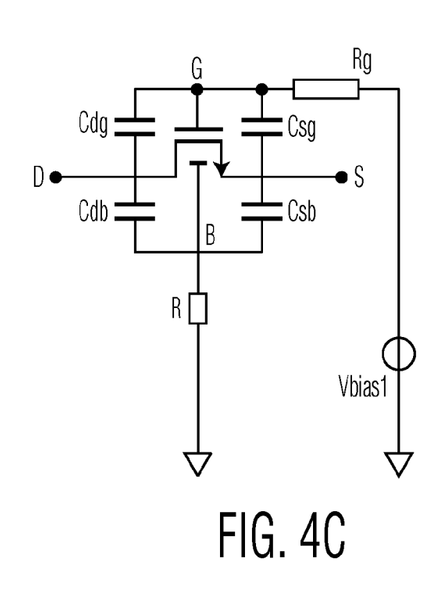
FIG. 4C shows yet another high-speed MOSFET switch, in accordance with another example embodiment of the present disclosure, similar to FIG. 4A but with a bias circuit configured to provide bias signal to the back-gate terminal via a resistance to the substrate.
Figure 4D:
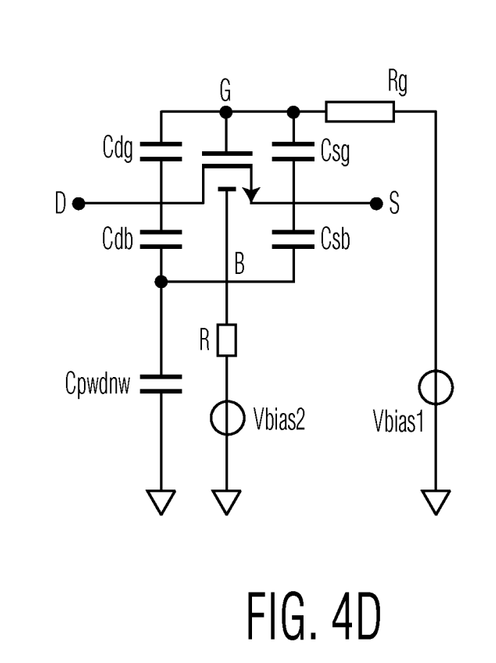
FIG. 4D shows another high-speed MOSFET switch, in accordance with another example embodiment of the present disclosure, similar to FIG. 4C but with an independent bias circuit coupled through a resistor to the back-gate and also modeling junction capacitances, such as for a triple well (with a P-type well and a deep N-type well)
Figure 4E:
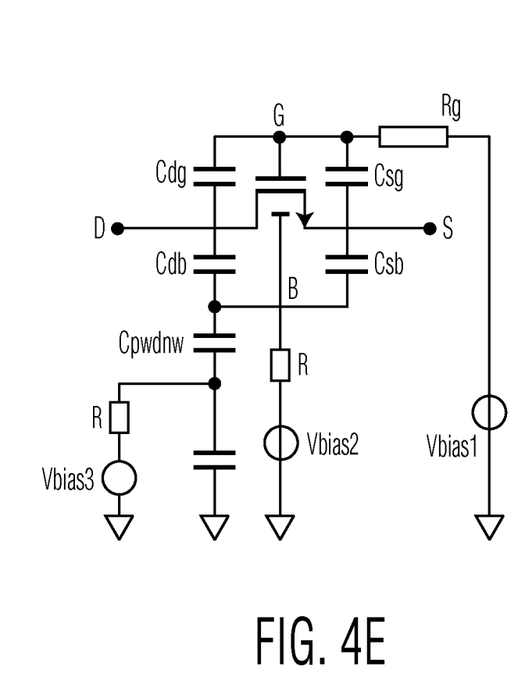
FIG. 4E shows another high-speed MOSFET switch, in accordance with another example embodiment of the present disclosure, similar to FIG. 4D but with yet another bias circuit for the deep N-type well and also modeling junction capacitances for a triple well (with a P-type well and a deep N-type well)

Different biasing circuits may be used in different implementations to facilitate provision of the follower signal to a back-gate terminal of the MOSFET. FIGS. 4C through 4E show switching circuits with some various biasing circuits, in accordance with various embodiments of the disclosure. FIG. 4C, shows a high-speed MOSFET switch with another bias circuit, in accordance with another example embodiment. The MOSFET switch is similar to that shown in FIG. 4B but has a bias circuit configured to provide a DC bias and a follower signal to the back-gate terminal (e.g., node B). For example, a DC bias signal may be provided though a resistive path though the substrate.

FIG. 4D, shows a high-speed MOSFET switch with yet another bias circuit, in accordance with another example embodiment. The MOSFET switch is similar to that shown in FIG. 4C and provides a DC bias and a follower signal to the back-gate terminal (e.g., node B) by applying a second DC bias signal (Vbias2) to the back-gate via a resistor (R). The model shown in FIG. 4D also models parasitic capacitance (Cpwndnw) between the back-gate and a deep N-well such as for a triple well (with a P-type well and a deep N-type well).

FIG. 4E shows another high-speed MOSFET switch, in accordance with another example embodiment of the present disclosure. The MOSFET switch is similar to that shown in FIG. 4D, but includes an additional bias circuit to provide a DC bias voltage (Vbias3) to the back-gate terminal via another resistor (R in FIG. 4E). For example, the Vbias3 voltage may be provided to a deep N-type well, as described with reference to FIG. 4D.

Figure 5A:
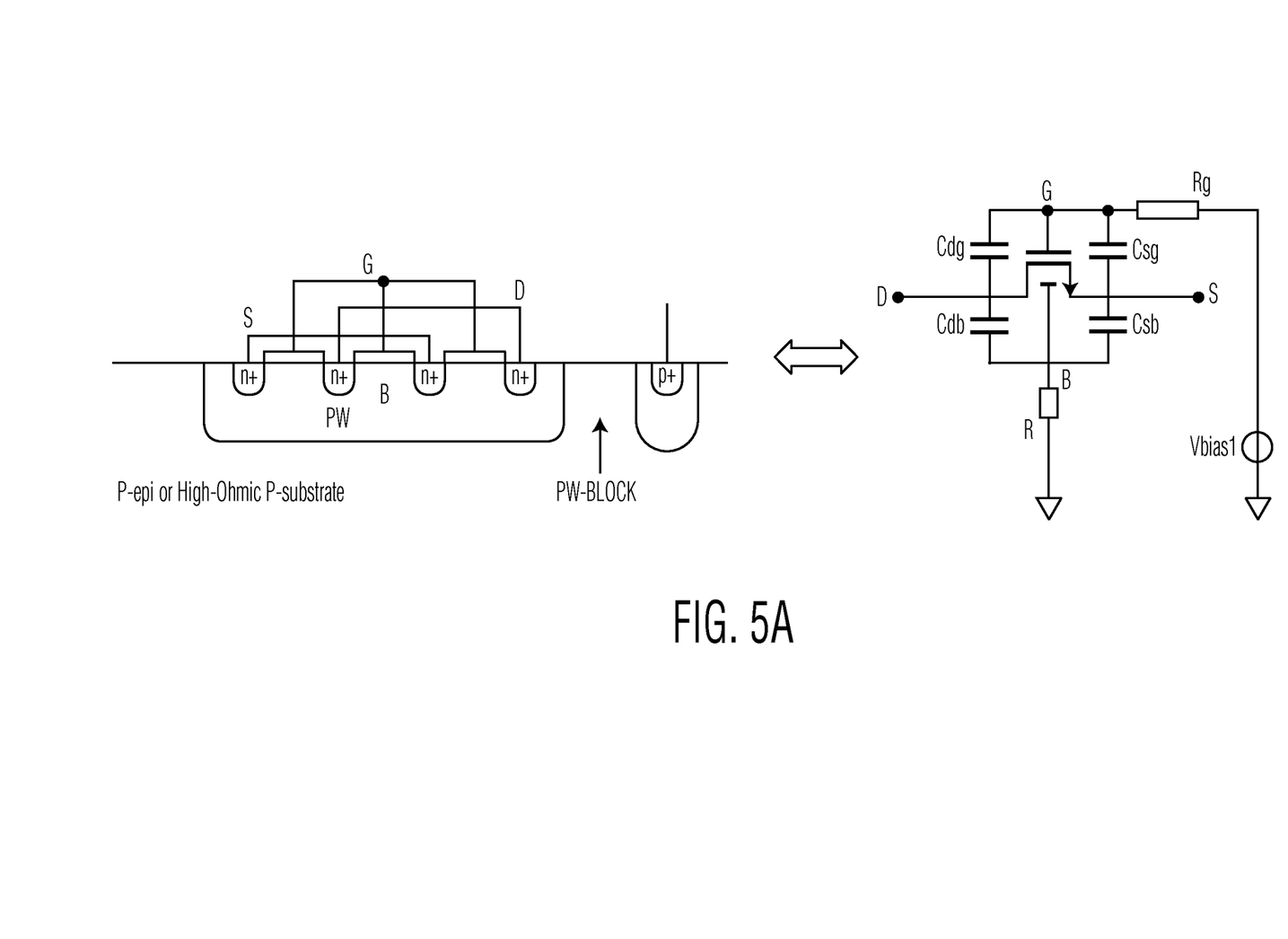
FIG. 5A shows a cross-section profile of a MOSFET switch to illustrate an exemplary physical layout and therein show the equivalent circuit diagram such as shown in FIG. 4C.
Figure 5B:
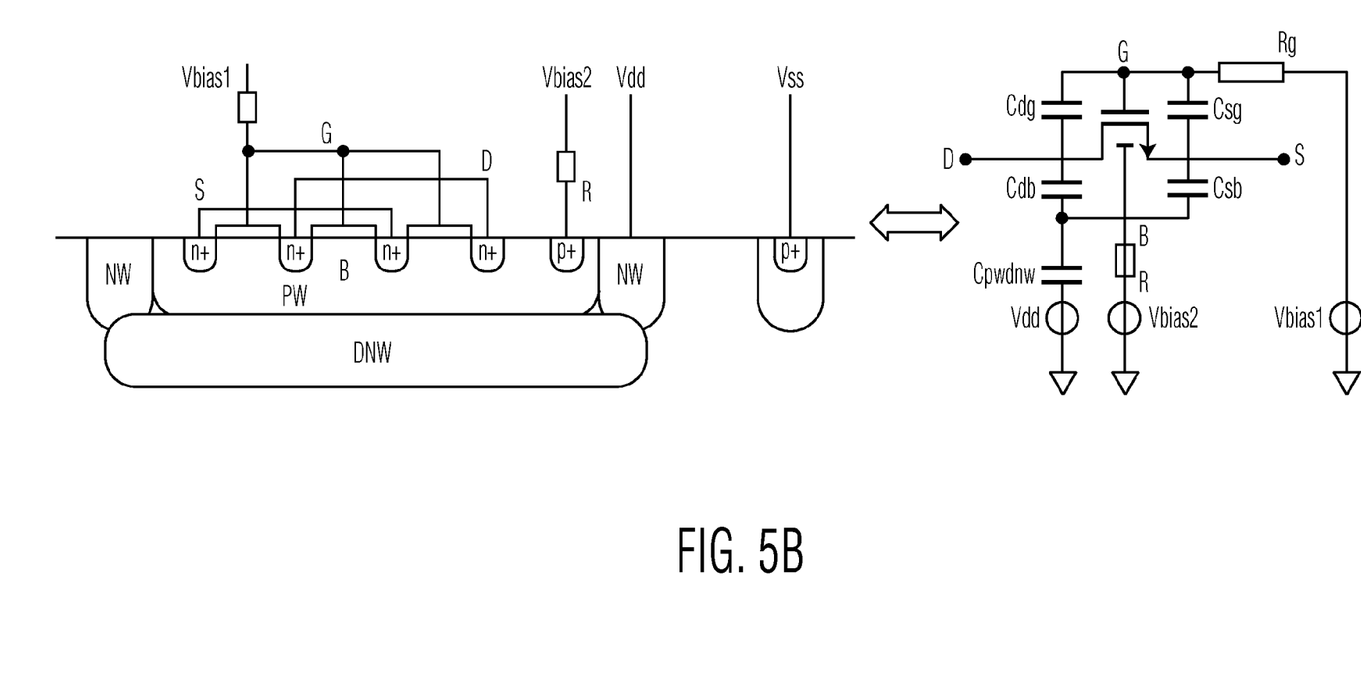
FIG. 5B shows a cross-section profile of a MOSFET switch to illustrate an exemplary physical layout and therein show an equivalent circuit diagram involving a triple well as shown in FIG. 4D.
Figure 5C:
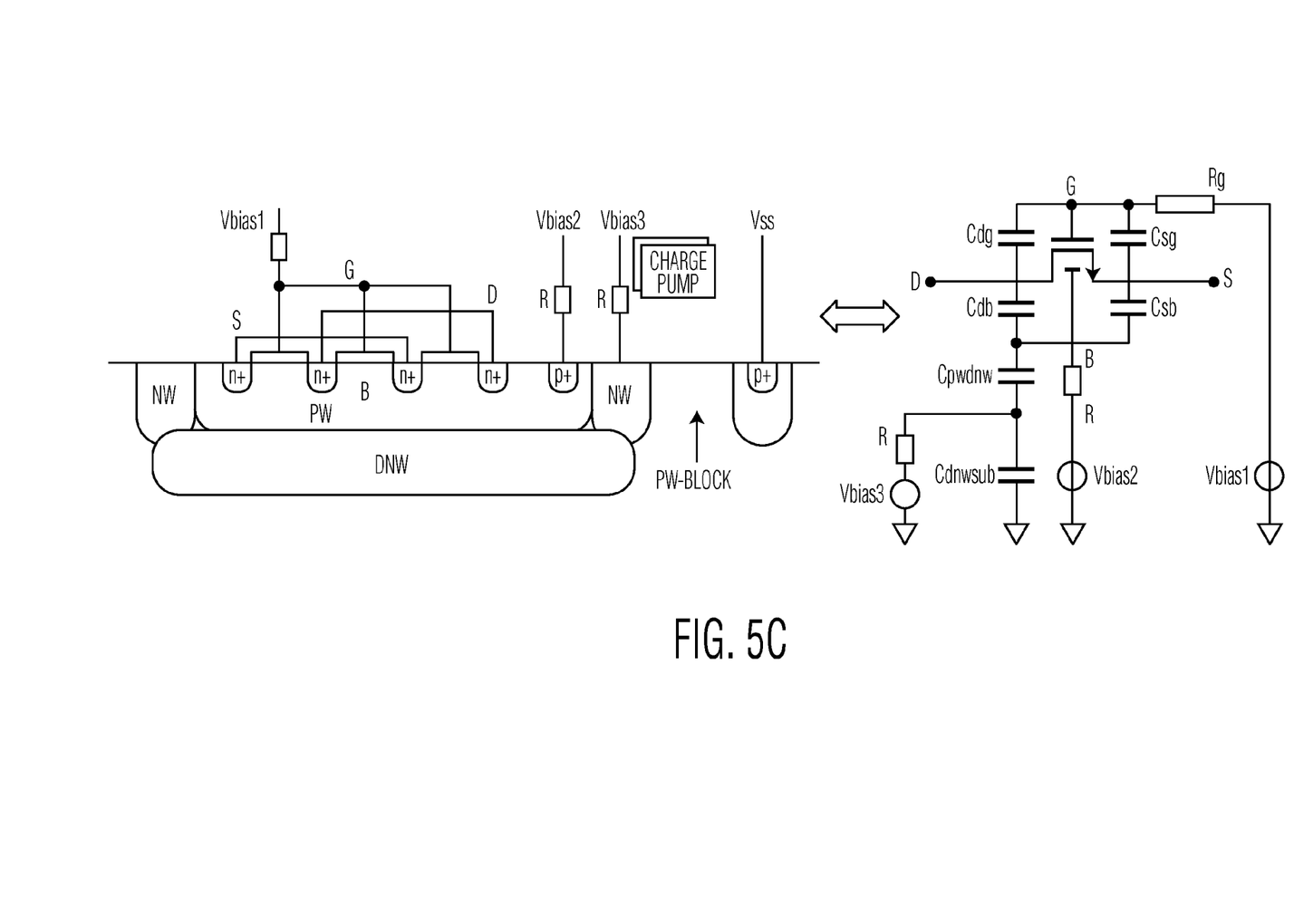
FIG. 5C shows a cross-section profile of a MOSFET switch to illustrate an exemplary physical layout and therein show an equivalent circuit diagram involving a triple well as shown in FIG. 4E.

FIGS. 5A, 5B, and 5C, show cross-sections of respective MOSFET semiconductors configured to implement the MOSFET switches shown in FIGS. 4C, 4D, and 4E, respectively. Each of the MOSFET semiconductors shown in FIGS. 5A, 5B, and 5C, include a plurality of source and drain regions in a P-well (PW) of a substrate (e.g., P-substrate). Gate regions are included on the P-well in-between the source and drain regions. As is typical, the number of source, drain, and gate regions in the MOSFET switch may be increased or decreased to achieve the desired aspect ratio of the device and, as may be applicable with the embodiments herein, to achieve a desired coupling to the back-gate terminal of the FET. The P-well region is a P-type region in which the back-gate terminals may be biased.

FIG. 5A shows a cross-section profile of a MOSFET switch to illustrate an exemplary physical layout and also shows the equivalent circuit diagram such as shown in FIG. 4C. In this example, the P-type substrate and a P-type resistance region therein are configured to pass current for presenting a DC voltage bias to the back-gate terminal residing in the P-well (PW), with series impedance in that path, thereby assisting to offset the loading caused by the inherent capacitances associated with the FET-based switch. In this configuration, the junction capacitance is placed in series with a resistance between the P-well (PW) and substrate connection. As a result, a high-pass filter is formed to filter bias signals provided to the P-well (PW) via the substrate.

In this example, impedance is increased from the back-gate terminal in the P-well region (PW) to other nodes by including additional path length of non-low-ohmic material. For instance, as shown in FIG. 5A, a P-type well tap (P-tap) is formed to the right of the P-well. The P-tap is separated from the P-well (PW) by a portion of the substrate (PW-block). The P-well block region will eliminate the lower impedance path at the surface between the P-well and the P-tap (as compared to the substrate) and increase the series impedance. The resistance of the path, and thus the strength of the bias voltage, depends on the distance at which the PW is separated from the P-tap by the PW-block region, and the resistivity of the substrate. Although, the maximum achievable series impedance in the substrate is limited, it should be noted that a few hundred ohm series resistance can already provide substantial improvement, since the typical high-speed signaling impedance is around 50 Ohm. Accordingly, as long as the parasitic loading impedance is substantially larger than 50 Ohm, it will have limited impact on the signal.

FIG. 5B shows a cross-section profile of a MOSFET switch to illustrate an exemplary physical layout and also shows an equivalent circuit diagram involving a triple well as shown in FIG. 4D. The profile is similar to that shown in FIG. 5A, but includes a second P-type well tap in the P-well (PW) of the switch. The second P-tap acts together with the P-well (PW) as a resistive path configured to provide a DC voltage bias (e.g., Vbias2) via a resistor (R) to a back-gate terminal in the P-well (PW), thereby assisting to offset the loading caused by the inherent capacitances associated with the FET-based switch. The extra resistor (R) increases the impedance towards the bias voltage, thereby improving the follower range and accuracy.

In some embodiments, the P-well (PW) may also be isolated from the substrate. For example, as shown in FIG. 5B, the P-well is isolated from the substrate by an N-type well ring (laterally around the PW) and a deep N-type well (DNW) that is formed underneath the PW and connecting with before-mentioned N-type well ring, thereby providing two pn barriers between P-well PW and substrate.

The isolated P-well region (PW) can be independently biased via a high impedance in the circuit design since there is no alternate ohmic path to the substrate. For high frequencies, the signal loading impedance consists now of two series connected capacitors, one from the bias signal to PW and the other from PW to DNW, where DNW is connected to a supply voltage.

In the configuration shown in FIG. 5B, there are two isolated wells, which can both be independently biased. As shown in the circuit model on the right in FIG. 5B, the junction capacitances couple to the P-well. The P-well is connected to Vbias2 with a resistive path to the DNW in series with another parasitic junction capacitor Cpwdnw. The DNW is connected to a voltage Vdd.

In embodiments that completely isolate PW, the PW/DNW junction and DNW/substrate junction enclose the whole device and may be fairly large. However, their capacitance is typically much lower than the source and drain junction capacitances. The reason for this is the lower capacitive density as doping levels are usually much lower and the gated effects are absent. Therefore, the effective signal loading capacitance is significantly reduced. Some embodiments may use other isolation techniques to increase impedance to the back-gate terminals. For instance, SOI technology could alternatively be used to isolate the back-gate terminal from the substrate.

FIG. 5C shows a cross-section profile of a MOSFET switch to illustrate an exemplary physical layout and also shows an equivalent circuit diagram involving a triple well as shown in FIG. 4E. The profile is similar to that shown in FIG. 5B, but further biases the N-type wells and the DNW with another bias signal (Vbias3). In this configuration, the P-well (PW) is connected to Vbias2 (via a first resistor, R) and to the DNW with another parasitic junction capacitor Cpwdnw. The DNW is connected to Vbias3 (via a second resistor, R), and to the substrate via yet another parasitic junction capacitor Cdnwsub. Bias signal Vbias2 is provided to a back-gate in the P-well (PW) via a first resistive path though the P-well (PW). The first and second resistors provide extra resistance on the paths that provide the bias signals (Vbias2 and Vbias3), as compared on the to the naturally present resistance in the PW, NW and DNW areas of the MOSFET.

In some embodiments, a charge pump may be used to provide the bias signal Vbias3 to the DNW. Junctions can typically withstand higher voltage than the basic FET structure, especially the lower doped P-well/DNW junction and the DNW/substrate junction. As the DNW bias has negligible impact on the NFET switch performance, its voltage can be pumped up by a charge pump to a high level while remaining below the safety limits for breakdown. For example, junctions of a FET may be biased to voltages as high as, or a few volts higher than the supply voltage Vdd (e.g., 3-10V) so long as the safety limits for breakdown are not exceeded. As the gate-follows-signal switch topology typically includes a charge pump to generate a higher supply voltage for controlling the DC gate bias, this can also be used to bias the DNW with a higher bias voltage than would otherwise be available. In some embodiments, a charge pump can alternately/additionally be used to bias the P-well (e.g., bias the P-well to a negative voltage).

In some embodiments increased reverse biasing of junctions may be used for improved off-state isolation at high frequency and reduced signal loading by another connected switch in off-state, as for that device, the junction capacitors form a capacitive-through coupling path across the FET switch. For further information regarding such increased reverse biasing, reference may made to U.S. patent application Ser. No. 13/835,554 to Madan Vemula, et al., entitled "CROSS TALK MITIGATION," this patent document is being filed concurrently herewith (incorporated by reference in its entirety for its teachings (generally) and specifically for the teachings therein regarding the related bias voltage control on the FET gate of the switch).

Some embodiments may be further configured to bias a gate of the FET switch so both the gate and the back-gate are biased with the follower signal. In such embodiments, high impedance gate bias circuitry removes loading of the signal from both the gate and back-gate terminals. Aspects related to such biasing of a gate are discussed in more detail in U.S. Patent Publication number 2012/0146705 (incorporated by reference herein in its entirety for its teachings generally and specifically for the teaching therein regarding the related bias voltage control).

Although the examples are primarily described with reference to individual FET switches, the embodiments are applicable to switching circuits using a large number of FET based switches (e.g., and M×N multiplexor). Similarly, although the examples are primarily described with reference to N-type FETs, the embodiments may also be applied to circuits implemented using P-type FETs, in which case all voltages and doping profiles will of course be different. Similarly, the skilled artisan would appreciate that the N-type FETs can be replaced with Complementary MOSFET (CMOS-type FET) with the follower signal provided in dual form for each of the complementary transistors in the CMOSFET arrangement. Further, such embodiments (and variations thereof) also be applied to SOI (Silicon on Insulator) implementations. Although the examples have primarily been described using FET transistors, the embodiments may be applied to other technologies which include junctions, where reducing the impact of junction capacitors could be beneficial in the application.

Based upon the above discussion and illustrations, those skilled in the art will readily recognize that various modifications and changes may be made without strictly following the exemplary embodiments and applications illustrated and described herein. For example, although embodiments may in some cases be described in individual figures, it will be appreciated that features from one figure can be combined with features of another figure, even though the combination is not explicitly shown or explicitly described as a combination. As another example, in some implementations the source and drain connections may be exchanged. Such modifications do not depart from the true spirit and scope of the present invention, including that set forth in the following claims.

What is claimed is:

1. A signal switching circuit comprising:
    a data link having a primary channel switchably connectable between at least two secondary channels;
    a FET-based switch including a FET transistor having gate, back-gate, source and drain terminals, the FET-based switch being configured and arranged to respond to control signals at the gate terminal
to operate in a signal-passing mode in which an AC signal is passed between the source and drain terminals by coupling a first portion of a signal between the source and drain terminals and another portion of the AC signal is diverted due to AC-coupling across inherent capacitances associated with the FET-based switch, and
to operate in another mode in which passage of the signal between the source and drain terminals is substantially blocked; and
    a biasing circuit configured and arranged to bias the back-gate terminal of the FET transistor with a follower signal and therein offset loading caused by the inherent capacitances associated with the FET-based switch.

2. The signal switching circuit of claim 1, wherein the inherent capacitances cause AC-coupling respectively to a gate-proximity side of the FET-based switch and another side of the FET-based switch, wherein the biasing circuit is further configured and arranged to bias the back-gate terminal of the FET transistor by driving the back-gate terminal using a signal-driver circuit to drive the back-gate terminal.

3. The signal switching circuit of claim 1, further including a controller circuit configured to selectively generate the control signals at the gate terminal and for controlling the modes and the application of an actuation voltage to the biasing circuit, thereby selectively presenting a voltage bias to the back-gate terminal depending on the controlled modes of operation.

4. The signal switching circuit of claim 1, wherein the biasing circuit is further configured and arranged to bias the back-gate terminal of the FET transistor by passively biasing the back-gate terminal, or by further including a DC biasing signal electrically coupled to provide a DC voltage bias to the back-gate terminal and thereby assist to offset the loading caused by the inherent capacitances associated with the FET-based switch.

5. The signal switching circuit of claim 1, wherein the biasing circuit is further configured and arranged to bias the back-gate terminal of the FET transistor by passively biasing the back-gate terminal toward a reference voltage so that impedance effectively loading the signal, as viewed from source or drain terminals, effects the offset loading caused by the inherent capacitances associated with the FET-based switch.

6. The signal switching circuit of claim 1, wherein the biasing circuit is further configured and arranged to bias the back-gate terminal of the FET transistor by driving the back-gate terminal using a signal-driver circuit to drive the back-gate terminal.

7. The signal switching circuit of claim 1, further including a P-type substrate and a P-type resistance region therein being configured and arranged to pass current for presenting a DC voltage bias to the back-gate terminal residing in a P-type well region adjacent to the P-type substrate thereby assisting to offset the loading caused by the inherent capacitances associated with the FET-based switch.

8. The signal switching circuit of claim 1, further including a resistor configured and arranged to pass current for presenting a DC voltage bias to the back-gate terminal at an isolated well region, thereby assisting to offset the loading caused by the inherent capacitances associated with the FET-based switch.

9. The signal switching circuit of claim 1, further including a substrate, wherein the inherent capacitances associated with the FET-based switch are offset by the DC voltage bias via a resistor being in a series resistance path for the current passing to the back-gate terminal, thereby providing a high-pass filter to the back-gate terminal.

10. The signal switching circuit of claim 1, further including a substrate, a first resistor, and a second resistor; the first resistor being configured and arranged to pass current for presenting a DC voltage bias to the back-gate terminal at an isolated well region, thereby assisting to offset the loading caused by the inherent capacitances associated with the FET-based switch; and the second resistor being configured and arranged to bias an N-type isolating layer underneath and around a P-type well region, which includes the back-gate terminal, to isolate the P-type well from the substrate, thereby facilitating reduction of the loading of the signal at high frequencies.

11. The signal switching circuit of claim 10, further including a deep N-well region arranged to form a junction with a P-type region in which the back-gate terminal receives current passed by the first resistor for presenting the DC voltage bias, and wherein the second resistor is arranged to pass current to the deep N-well region for presenting another DC bias voltage to that region.

12. A signal switching circuit comprising:
a multiplexor configured and arranged for switchably connecting a data link having primary channel between two secondary channels;
a substrate;
for each channel, a FET-based switch including a FET transistor having gate, back-gate, source and drain terminals, the FET-based switch being configured and arranged to respond to control signals at the gate terminal
to operate in a signal-passing mode in which an AC signal is passed between the source and drain terminals by coupling a first portion of the AC signal between the source and drain terminals and another portion of the AC signal is diverted due to AC-coupling across inherent capacitances associated with the FET-based switch, and
to operate in another mode in which passage of the signal between the source and drain terminals is substantially blocked; and
a biasing circuit configured and arranged to bias the back-gate terminal of the FET transistor with a follower signal, wherein, in response to the control signals at the gate terminal, said at least one channel connects one of said at least two channels of the primary data link and the biasing circuit biases the back-gate terminal of the FET transistor to offset loading caused by the inherent capacitances associated with the FET-based switch.

13. The signal switching circuit of claim 12, wherein the follower signal tracks with the first portion of the AC signal, and further includes a DC biasing signal electrically coupled to provide a DC voltage bias to the back-gate terminal and thereby assist to offset the loading caused by the inherent capacitances associated with the FET-based switch.

14. The signal switching circuit of claim 12, wherein the inherent capacitances cause AC-coupling respectively to a gate-proximity side of the FET-based switch and another side of the FET-based switch that is nearer to the substrate.

15. The signal switching circuit of claim 12, wherein the biasing circuit is further configured and arranged to bias the back-gate terminal of the FET transistor by driving the back-gate terminal using a signal-driver circuit to drive the back-gate terminal with the follower signal.

16. The signal switching circuit of claim 12, further including a substrate and a resistor, the resistor being configured and arranged to pass current for presenting a DC voltage bias to the back-gate terminal at an isolated well region adjacent to the substrate thereby assisting to offset the loading caused by the inherent capacitances associated with the FET-based switch.

17. The signal switching circuit of claim 12, further including a resistor configured and arranged to pass current for presenting a DC voltage bias to the back-gate terminal at an isolated well region thereby assisting to offset the loading caused by the inherent capacitances associated with the FET-based switch.

18. The signal switching circuit of claim 12, further including a substrate, wherein the inherent capacitances associated with the FET-based switch are offset by the DC voltage bias via a resistor being in a series resistance path to the back-gate terminal, thereby providing a high-pass filter to the back-gate terminal.

19. The signal switching circuit of claim 12, further including a first resistor and a second resistor; the first resistor being configured and arranged to pass current for presenting a DC voltage bias to the back-gate terminal at an isolated well region, thereby assisting to offset the loading caused by the inherent capacitances associated with the FET-based switch, and further including a deep N-well region arranged to form a junction with a P-type region that includes the back-gate terminal; the second resistor being arranged to pass current the deep N-well region for presenting another DC bias voltage to the deep N-well region.

20. The signal switching circuit of claim 19, further comprising a charge pump configured and arranged to provide a bias voltage to the deep N-well region.

21. The signal switching circuit of claim 20, further comprising a charge pump configured and arranged to provide a bias voltage that is greater than a positive supply voltage for the signal switching circuit, through the second resistor, to the deep N-well region.

22. The signal switching circuit of claim 1, further comprising a charge pump configured and arranged to provide a bias voltage to a P-well containing the back-gate terminal.

23. The signal switching circuit of claim 22, wherein the bias voltage, as provided via the charge pump, is a negative voltage.

* * * * *